United States Patent [19]

Kameyama

[11] 4,445,967

[45] May 1, 1984

[54] METHOD FOR MANUFACTURING SEMICONDUCTOR DEVICE

[75] Inventor: Shuichi Kameyama, Yokohama, Japan

[73] Assignee: Tokyo Shibaura Denki Kabushiki Kaisha, Kawasaki, Japan

[21] Appl. No.: 423,092

[22] Filed: Sep. 24, 1982

[30] Foreign Application Priority Data

Feb. 3, 1982 [JP] Japan .................................. 57-14853

[51] Int. Cl.³ .................. H01L 21/306; H01L 21/312; B44C 1/22; C03C 15/00

[52] U.S. Cl. ................................ 156/648; 29/576 W; 29/580; 148/187; 156/651; 156/653; 156/657; 156/661.1; 357/49; 427/88; 430/313

[58] Field of Search ............... 156/643, 644, 648, 649, 156/651, 652, 653, 657, 659.1, 661.1, 662; 148/1.5, 187; 29/571, 576 W, 578, 580; 427/88, 427/89, 90, 93; 357/23, 47, 48, 49, 50, 56; 430/312, 430/313, 316, 317

[56] References Cited

PUBLICATIONS

IBM Technical Disclosure Bulletin, vol. 19, No. 12 (May 1977), Minimizing "Bird's Beak" When Forming Recessed Dielectric Isolation by I. Antipov, pp. 4596-4597.
"A New Bird's-Beak Free Field Isolation Technology for Vlsi Devices", K. Kurosawa et al., IEDM Dig. Tech. Papers, pp. 384-387 (1981).

Primary Examiner—William A. Powell
Attorney, Agent, or Firm—Finnegan, Henderson, Farabow, Garrett & Dunner

[57] ABSTRACT

The invention provides a method for manufacturing a semiconductor device, comprising the steps of: forming a mask material pattern at least on a portion of a semiconductor layer which corresponds to a prospective element formation region; etching the semiconductor layer, using the mask material pattern, to form a first groove which is wide and shallow; burying a first isolating material in the first groove to a thickness substantially equal to the depth of the first groove; etching a portion of the first isolating material film which is located in the vicinity of the prospective element formation region to partially expose a bottom of the first groove, thereby forming a second groove which is narrower than said first groove, a position of the second groove being defined by the mask material pattern; forming a third groove which is deeper than said first and second grooves by etching a bottom of the second groove; and burying a second isolating material in the third groove.

13 Claims, 21 Drawing Figures

F I G. 1A
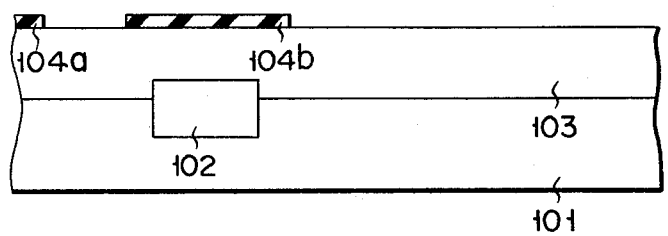
F I G. 1B
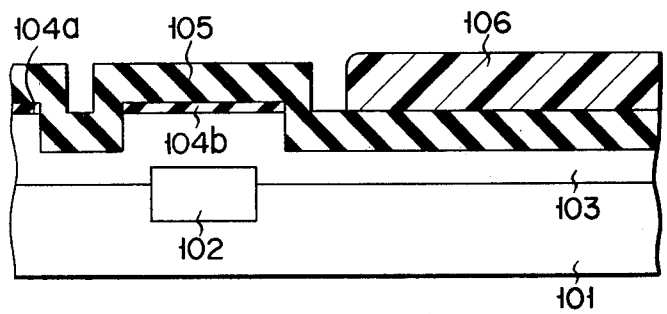
F I G. 1C
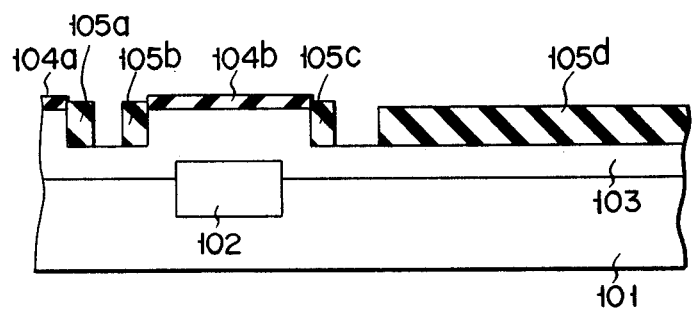
F I G. 1D
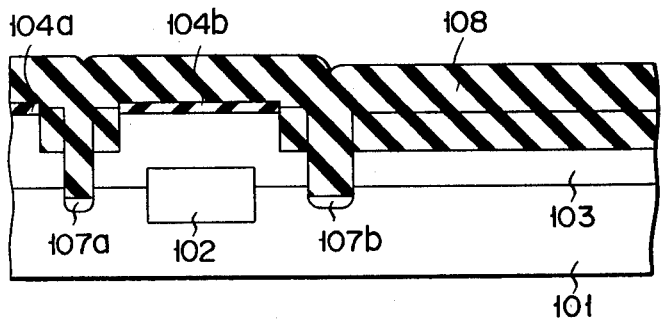

METHOD FOR MANUFACTURING SEMICONDUCTOR DEVICE

BACKGROUND OF THE INVENTION

The present invention relates to a method for manufacturing a semiconductor device and, more particularly, to an improvement in an isolation technique for manufacturing an IC or LSI.

Generally, p-n junction isolation or selective oxidation has been used as an isolation technique for manufacturing a semiconductor device, particularly, a bipolar IC or MOSIC. However, such an isolation technique has various drawbacks. For example, according to the p-n junction isolation method, lateral diffusion of an impurity in an isolating diffusion region is great, so that the packing density of the semiconductor device is decreased. According to the selective oxidation method, mechanical stress due to extension of an oxide film into the element region at the end of the field region is increased to cause crystal defects, and a dimensional change is increased due to the extension of the oxide film. Therefore, neither the p-n junction isolation method nor the selective oxidation method is suitable to manufacture a highly integrated LSI.

Various studies have been made recently in consideration of the above problems, and a number of new isolation techniques have been proposed. For example, an isolation method is described in "Int. Electron Devices Meeting Dig. Tech. Paper", PP. 384 to 387, 1981. This method comprises the steps of forming a groove which has a desired depth by etching a silicon layer of a perspective wide isolating region, depositing a silicon oxide film as an isolating material to cover the entire surface, leaving an isolating material film in the wide groove by selectively etching by the lift-off method a portion of the silicon oxide film which corresponds to a prospective element formation region, depositing another silicon oxide film on the entire surface, and back-etching the silicon oxide film to expose the surface portion of the semiconductor layer which corresponds to the prospective isolation formation region so as to bury the narrow groove between the isolating material film and the portion of the semiconductor layer which corresponds to the prospective element formation region.

According to the above method, it is possible to principle to leave the isolating film (field film) in the wide and narrow process of the same depth. In the semiconductor device such as a bipolar IC or a CMOS transistor, a narrow but deep isolating region may often be required in addition to the shallow isolating region. For example, when a narrow but deep insulating material isolation region is formed in place of the p-n junction isolation region of the bipolar element, or the narrow but deep insulating material is formed to provide a channel cut in the vicinity of the well region of the CMOS element or to prevent the latch-up phenomenon, the performance of the semiconductor element is greatly improved. Furthermore, micronization of the element can be achieved. However, according to the method described above, such a narrow but deep insulating material isolation layer can hardly be formed.

SUMMARY OF THE INVENTION

It is an object of the present invention to provide a method for manufacturing a highly reliable and highly integrated semiconductor device, wherein a relatively narrow but deep isolating region and a relatively wide but shallow isolating region combined thereto in self-alignment may be formed at the same surface level of that portion of a semiconductor layer which corresponds to a prospective element formation region with excellent step coverage, thus preventing disconnection of an interconnection electrode.

In order to achieve the above embodiment of the present invention, there is provided a method for manufacturing a semiconductor device, comprising the steps of:

forming a mask material pattern at least on a portion of a semiconductor layer which corresponds to a prospective element formation region;

etching said semiconductor layer, using said mask material pattern, to form a first groove which is wide and shallow;

burying a first isolating material in said first groove to a thickness substantially equal to the depth of said first groove;

etching a portion of said first isolating material film which is located in the vicinity of said prospective element formation region to expose a bottom of said first groove, thereby forming a second groove which is narrower than said first groove, a position of said second groove being defined by said mask material pattern;

forming a third groove which is narrower and deeper than said first groove by etching a bottom of said second groove; and burying a second isolating material in said third groove.

BRIEF DESCRIPTION OF THE DRAWINGS

FIGS. 1A to 1G are sectional views for explaining the steps of manufacturing a bipolar transistor according to an embodiment of the present invention;

DETAILED DESCRIPTION OF THE PREFERRED EMBODIMENTS

Figure 1E:
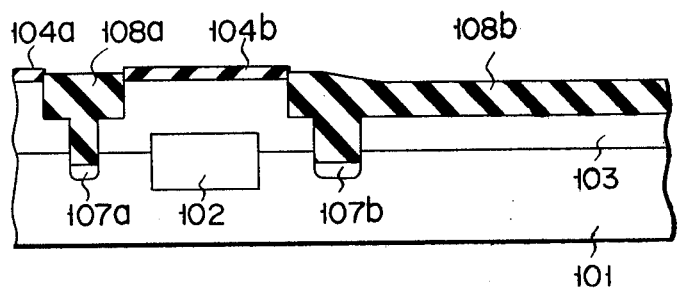

The present invention will be described in detail with reference to the accompanying drawings.

A mask material pattern which has an opening corresponding to a prospective wide groove formation region is formed on a semiconductor layer. The mask material pattern may comprise one of the various multilayer structures such as two-layer and three-layer structures in addition to a one-layer structure. The mask material preferably has a resistance to etching when a groove is formed in the semiconductor layer. For example, an insulating film such as a CVD-SiO$_2$ film or a silicon nitride film may be used as the mask material pattern. In some cases, a conductive film such as a polycrystalline silicon film, a metal silicide film or a metal film can be used.

The semiconductor layer is selectively etched, using the mask material pattern formed thereon, to form a first groove which is wide and shallow, around the periphery of the prospective element formation region. When anisotropic etching such as reactive ion etching (RIE) is used, the side walls of the first groove are vertically or substantially vertically formed. However, in order to fill the isolating material in the first groove in the subsequent process, the first groove is preferably tapered toward its bottom.

A first isolating material film is formed at least in the first groove to a thickness substantially equal to the depth of the first groove. The first isolating material film may be formed by the following methods; a method in which an isolating material is deposited to cover the entire surface including the inner walls of the first groove by the CVD method, the PVD method or the like; a method in which the inner walls of the first groove are directly oxidized to fill it with silicon oxide; and a method in which a material such as polycrystalline silicon is filled in the first groove and is oxidized. The first insulating material may comprise an insulating material such as $SiO_2$, $Si_3N_4$ or $Al_2O_3$. A low melting-point insulating material such as phospho-silicate glass (PSG), arseno-silicate glass (AsSG) or boro-silicate glass (BSG) may also be used. Furthermore, a conductive material such as impurity-doped or undoped polycrystalline silicon or a metal silicide may be used as part of the insulating film. In this case, before the conductive material is deposited, an oxide or nitride film must be formed on the inner walls of the first groove by oxidation or nitrification to a thickness that the first groove may not be completely filled with the oxide or nitride film. In this case, when the conductive material is patterned after it is deposited in the first groove and when an insulating material is filled in an opening in the conductive material pattern, the conductive material pattern can be used as an interconnection layer.

The first isolating material film is selectively etched to partially expose the bottom of the first groove in the vicinity of the prospective element formation region. In other words, a second groove which is narrow and shallow is formed in the vicinity of the prospective element formation region in the first groove. At this time, the first isolating material film portions are left in the first groove. The second groove may be formed by the lift-off method, which is known to those skilled in the art or the patterning method using a mask pattern.

The bottom of the second groove is further etched to form a third groove which is narrow and deep. The width of the second or third groove is determined by etching variations of the second groove is formed by the lift-off method. However, if the patterning method using the mask is utilized, the precision of the mask alignment determines the width of the second or third groove. In both cases, it is possible to control the width of the groove to be about 1 to 2 $\mu$m or less.

The second isolating material is filled in the third groove. The second isolating material may be selected from the materials for the first isolating material. Various methods can be applied to the formation of the second isolating material layer, such as the oxidation method and a method in which the second isolating material is formed to cover the entire surface to a thickness greater than half the width of the third groove and is etched back to leave the second isolating material in the third groove.

As described above, according to the method of the present invention, narrow but deep isolating regions and wide but shallow isolating regions combined thereto in self-alignment may be formed at the same surface level of that portion of a semiconductor layer which corresponds to a prospective element formation region, thus preventing disconnection of an interconnection electrode. Therefore, a highly integrated and highly reliable semiconductor device such as a bipolar IC and a MOSIC can be obtained.

Examples of the present invention will be described with reference to the accompanying drawings. Examples 1 and 2 show cases in which the present invention is applied to the manufacture of a bipolar npn transistor, and Example 3 shows a case in which the present invention is applied to the manufacture of a CMOS transistor.

EXAMPLE 1

As shown in FIG. 1A, an n-type buried layer 102 was selectively formed on a p-type silicon substrate 101. An n-type semiconductor layer 103 was grown by an epitaxial method on the p-type silicon substrate 101. Subsequently, mask patterns 104a and 104b which were comprised of silicon nitride films were formed on the n-type semiconductor layer 103.

As shown in FIG. 1B, the n-type semiconductor layer 103 was selectively etched using the mask patterns 104a and 104b to form narrow and wide first grooves so as to provide element isolation regions. CVD-$SiO_2$ 105 as a first isolating material was deposited on the entire surface to a thickness so as not to completely fill the first narrow groove, the thickness being substantially equal to the depth of the first grooves. A photoresist pattern 106 was then formed by photoetching on a wide element isolation region.

As shown in FIG. 10, the film comprising CVD-$SiO_2$ 105 was etched by reactive ion etching using the photoresist pattern 106 as a mask to partially expose the bottom portion of the wide first groove and form a narrow second groove in the narrow prospective element isolation region. Thereafter, the photoresist pattern 106 was removed. Since anisotropic etching such as the RIE method provided vertical etching with respect to the major surface of the n-type semiconductor layer 103, CVD-$SiO_2$ patterns 105a, 105b and 105c were left only on the side walls of the narrow and wide first grooves. A wide field region 105d was also formed in the wide first groove.

As shown in FIG. 1D, the bottom of the second grooves were further etched to form third grooves and boron was ion-implanted in the bottom portions of the narrow third grooves to form p-type channel cut regions 107a and 107b, and CVD-$SiO_2$ 108 as a second isolating material was deposited to cover the entire surface of the n-type semiconductor layer 103 to a thickness sufficiently greater than half the width of the narrow third grooves.

As shown in FIG. 1E, the film comprising CVD-$SiO_2$ 108 was etched back to expose the surfaces of the mask patterns 104a and 104b which were comprised of silicon nitride films.

Figure 1F:
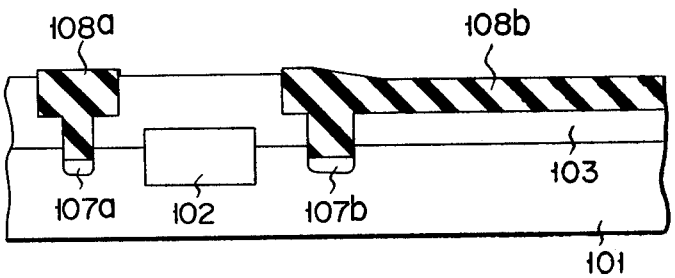

As shown in FIG. 1F, the mask patterns 104a and 104b were etched to expose the surface portion of the semiconductor layer 103 which corresponded to the prospective element formation region. In this manner, a field region 108b combining the wide but shallow isolation region with the narrow but deep isolation region was formed, and a narrow isolation region 108a was formed.

Figure 1G:
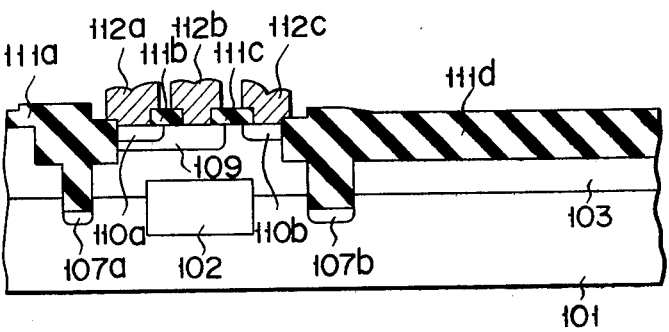

As shown in FIG. 1G, after a p-type base region 109, an n-type emitter region 110a and an n-type collector region 110b of an npn transistor were formed by the conventional method in the prospective element formation region, silicon oxide patterns 111a, 111b, 111c and 111d were formed. An emitter electrode 112a, a base electrode 112b and a collector electrode 112c were formed. Thus, the bipolar npn transistor was prepared.

EXAMPLE 2

Figure 2A:
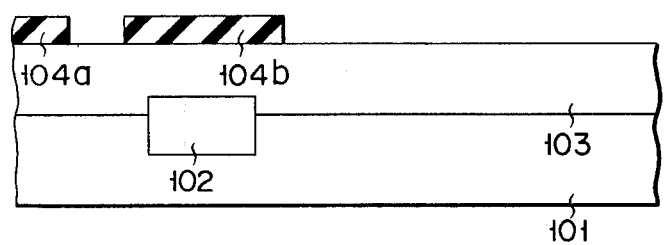
FIGS. 2A to 2H are sectional views for explaining the steps of manufacturing a bipolar transistor according to another embodiment of the present invention.

As shown in FIG. 2A, an n-type buried layer 102 was selectively formed in a p-type silicon substrate 101. An n-type semiconductor layer 103 was then grown by the epitaxial method on the p-type semiconductor substrate 101. Thereafter, mask patterns 104a and 104 which were comprised of silicon nitride films were formed on the n-type semiconductor layer 103.

Figure 2B:
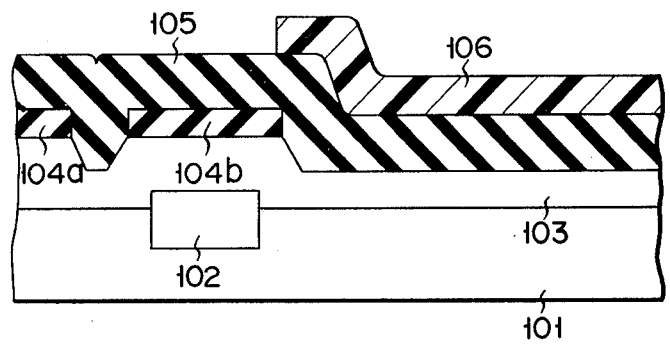

As shown in FIG. 2B, the n-type silicon layer 103 was etched by an anisotropic etchant of a KOH type using the mask patterns 104a and 104b to form narrow and wide first grooves which are tapered toward its bottom. CVD-SiO$_2$ 105 as a first isolating material was deposited to cover the entire surface to a thickness substantially corresponding to the depth of the first grooves. A photoresist pattern 106 was then formed by photoetching to cover the wide first groove through the film of CVD-SiO$_2$ 105.

Figure 2C:
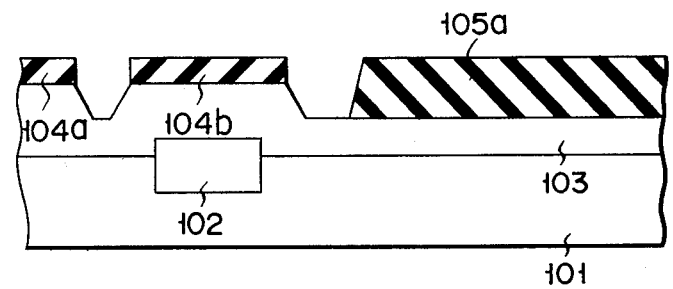

As shown in FIG. 2C, the film of CVD-SiO$_2$ 105 was etched by isotropic etching using a wet etchant of ammonium fluoride to leave a CVD-SiO$_2$ pattern which functioned as a field film in the wide first groove, thereby forming a narrow second groove in the wide first groove. By this etching, the portion of the isolating material in the vicinity of the prospective element formation region was removed so as to partially expose the bottoms of the narrow second grooves.

Figure 2D:
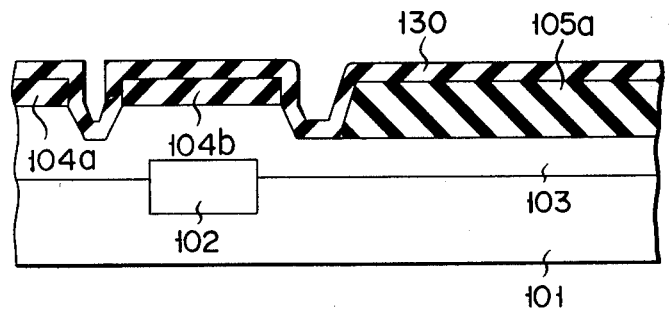

As shown in FIG. 2D, CVD-SiO$_2$ 130 was then deposited to cover the surface to an extent that the narrow second grooves were not filled with the CVD-SiO$_2$ 130.

Figure 2E:
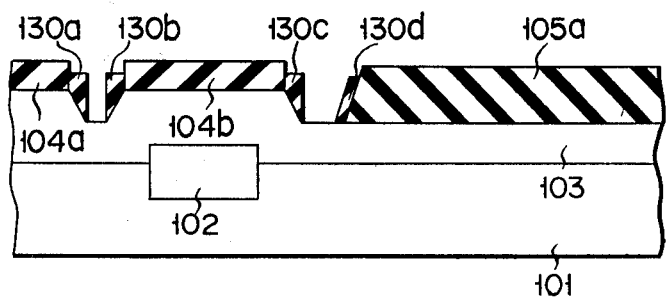

As shown in FIG. 2E, the film of the CVD-SiO$_2$ 130 was etched by anisotropic etching such as the RIE method to leave CVD-SiO$_2$ patterns 130a, 130b, 130c and 130d.

Figure 2F:
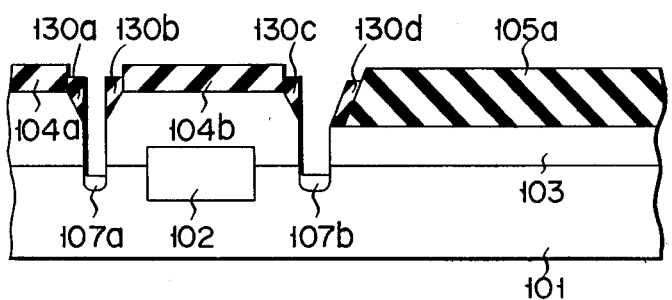

As shown in FIG. 2F, the bottoms of the narrow second grooves defined by the CVD-SiO$_2$ patterns 130a, 130b, 130c and 130d were etched using the above patterns as masks to form narrow and deep third grooves whose bottoms reached the p-type semiconductor layer 101. Boron was ion-implanted in the bottoms of the narrow and deep third grooves to form p-type channel cut regions 107a and 107b.

Figure 2G:
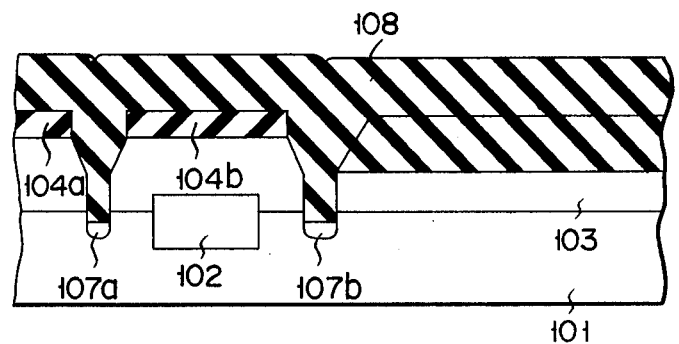

As shown in FIG. 2G, a CVD-SiO$_2$ film 108 was deposited to cover the entire surface to a thickness greater than half of the width of the third grooves, so that the third grooves were filled therewith.

Figure 2H:
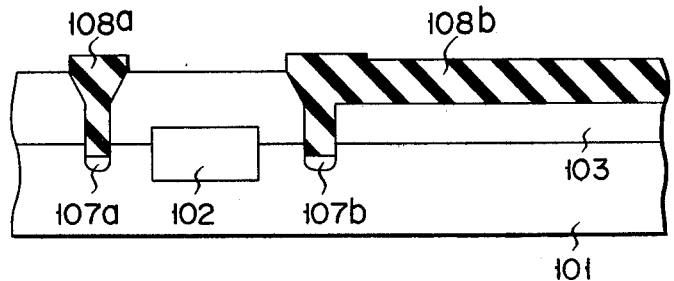

As shown in FIG. 2H, after the CVD-SiO$_2$ film 108 was etched back to expose the mask patterns 104a and 104b, the mask patterns 104a and 104b were removed. In this manner, a field region 108b which was constituted by a wide but shallow isolation region and a narrow but deep isolation region, and an element isolation region 108a which had a narrow width were formed. Finally, an npn transistor (not shown) was formed in an island region including the buried region 102.

EXAMPLE 3

Figure 3A:
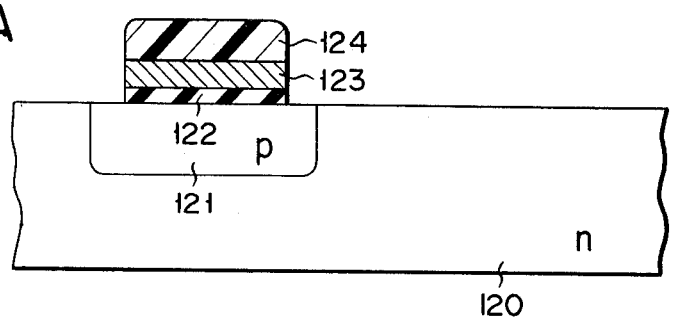
FIGS. 3A to 3F are sectional views for explaining the steps of manufacturing a CMOS transistor according to still another embodiment of the present invention.

As shown in FIG. 3A, a p-type well region 121 was selectively formed in a portion of an n-type semiconductor substrate 120 by ion implantation. A silicon nitride film, an aluminum film and a photoresist film were sequentially deposited to cover the entire surface of the n-type semiconductor substrate 120, and the photoresist film, the silicon nitride film and the aluminum film were patterned to form a resist pattern 124, a silicon nitride pattern 122 and an Al pattern 123.

Figure 3B:
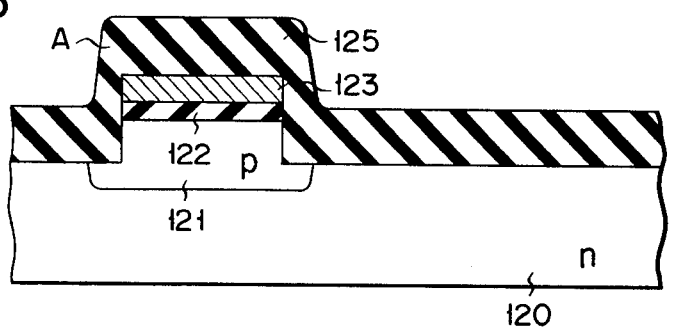

As shown in FIG. 3B, the exposed portion of the n-type semiconductor substrate 120 was etched using the photoresist pattern 124, the Al pattern 123 and the silicon nitride pattern 122 as a mask to form wide and shallow first grooves. After the photoresist pattern 124 was removed, an SiO$_2$ film 125 was deposited by plasma deposition to cover the entire surface.

Figure 3C:
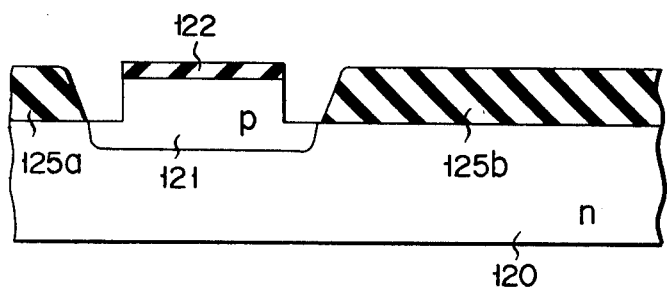

As shown in FIG. 3C, steps A of the SiO$_2$ film 125 in the vicinity of the side surfaces of a portion corresponding to a prospective element formation region were selectively etched to expose the side surfaces of the Al pattern 123. Acid treatment was then performed to etch the Al pattern 123, so that the SiO$_2$ film on the Al pattern 123 was selectively removed by the lift-off method. Thus, SiO$_2$ patterns 125a and 125b were left, thereby forming narrow and shallow second grooves which surrounded the prospective element formation region.

Figure 3D:
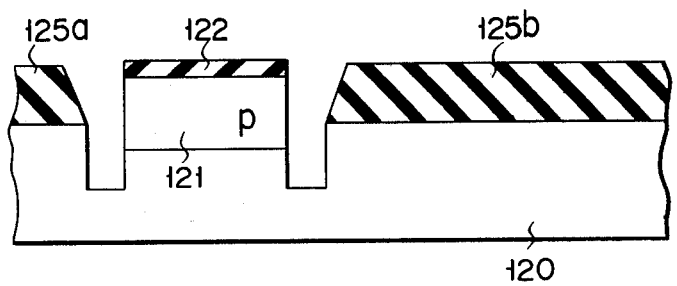

As shown in FIG. 3D, the bottom portions of the narrow and shallow second grooves were etched by anisotropic etching such as the RIE method to form narrow and deep third grooves. It may be preferable to ion-implant an impurity to form n-type channel cut regions in the bottoms so as to prevent the latch-up phenomenon.

Figure 3E:
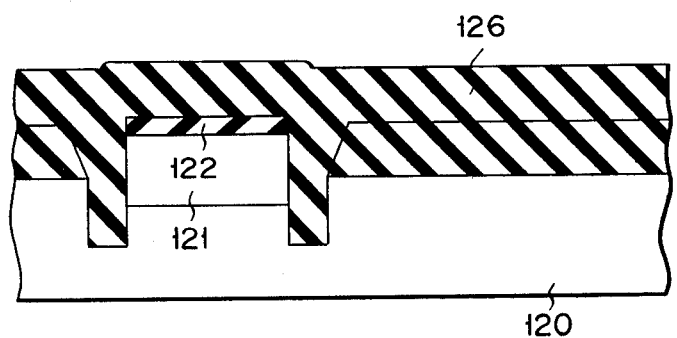

As shown in FIG. 3E, a CVD-SiO$_2$ film 126 as a second isolation material was deposited to cover the entire surface to a thickness greater than half the width of narrow and deep third grooves, so that the narrow and deep third grooves were filled therewith.

Figure 3F:
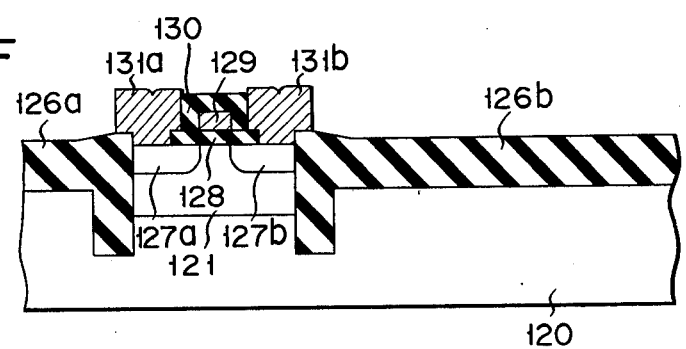

As shown in FIG. 3F, the CVD-SiO$_2$ film 126 was back-etched to expose the surface of the silicon nitride pattern 122, and the silicon nitride pattern 122 was removed. Thereafter, in accordance with the conventional process, in and on the p-type well region 121, an n-type source region 127a, an n-type drain region 127b, a gate oxide film 128, a polycrystalline silicon gate 128, an insulating oxide film 130, a source electrode 131a, and a drain electrode 131b were formed. Thus, an n-channel MOS transistor was prepared.

What is claimed is:

1. A method for manufacturing a semiconductor device, comprising the steps of:
   forming a mask material pattern at least on a portion of a semiconductor layer which corresponds to a prospective element formation region;
   etching said semiconductor layer, using said mask material pattern, to form a first groove which is wide and shallow;
   burying a first isolating material in said first groove to a thickness substantially equal to the depth of said first groove;
   etching a portion of said first isolating material film which is located in the vicinity of said prospective element formation region to partially expose a bottom of said first groove, thereby forming a second groove which is narrower than said first groove, a position of said second groove being defined by said mask material pattern;
   forming a third groove which is deeper than said first and second grooves etching a bottom of said second groove; and
   burying a second isolating material in said third groove.

2. A method according to claim 1, wherein the step of forming said second groove is performed by using another mask material pattern.

3. A method according to claim 2, wherein the step of forming said second groove comprises the steps of forming said another mask material pattern on a surface portion of said first isolating material film in said first groove which is spaced apart for a distance large enough to form said second groove in the vicinity of said prospective element formation region, and performing anisotropic etching.

4. A method according to claim 2, wherein the step of forming said second groove comprises the steps of forming said another mask material pattern to cover the entire surface of said first isolating material film in said first groove, and performing isotropic etching.

5. A method according to claim 1, wherein the step of forming said second groove is performed by the lift-off method using said mask material pattern.

6. A method according to claim 1, wherein said first and second isolating materials are materials selected from the group consisting of $SiO_2$, $Si_3N_4$, $Al_2O_3$, phospho-silicate glass, arseno-silicate glass and boro-silicate glass.

7. A method according to claim 1, wherein said first isolating material comprises an insulating material and a conductive material surrounded thereby.

8. A method according to claim 7, wherein said conductive material comprises a material selected from the group consisting of polycrystalline silicon and metal silicides.

9. A method according to claim 1, wherein the step of filling said first groove with said first isolating material comprises the step of depositing said first isolating material to cover the entire surface.

10. A method according to claim 1, wherein the step of filling said first groove with said first insulating material comprises the step of oxidizing an inner wall of said first groove.

11. A method according to claim 1, wherein the step of filling said first groove said first insulating material comprises the steps of depositing a material to be oxidized in said first groove and oxidizing said material.

12. A method according to claim 1, wherein the step of filling said third groove with said second isolating material comprises the steps of depositing said second isolating material to cover the entire surface to a thickness greater than half the width of said third groove, and etching back said second isolating material to expose a surface portion of a region except for said second groove.

13. A method according to claim 1, further including the step of forming a channel cut region by doping an impurity in a bottom of said third groove after said third groove is formed.

* * * * *